United States Patent
Ui

(10) Patent No.: US 7,388,429 B2
(45) Date of Patent: Jun. 17, 2008

(54) AMPLIFIER CIRCUIT, CONTROL METHOD OF THE SAME, AND AMPLIFIER CIRCUIT MODULE

(75) Inventor: Norihiko Ui, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 140 days.

(21) Appl. No.: 11/273,404

(22) Filed: Nov. 15, 2005

(65) Prior Publication Data
US 2006/0108660 A1    May 25, 2006

(30) Foreign Application Priority Data
Nov. 19, 2004  (JP) .............................. 2004-335982

(51) Int. Cl.
*H03F 1/26* (2006.01)
(52) U.S. Cl. .................................... 330/149; 455/114.3
(58) Field of Classification Search ................ 330/149, 330/295, 310; 257/491–492
See application file for complete search history.

(56) References Cited

U.S. PATENT DOCUMENTS 6,750,724 B1 *   6/2004   Mori et al. ................. 330/310
7,193,461 B2 *   3/2007   Mobin et al. ............... 330/149
7,259,630 B2 *   8/2007   Bachman et al. ........... 330/297

FOREIGN PATENT DOCUMENTS

| JP | 05-121958 A | 5/1993 |
| JP | 9-246471 | 9/1997 |
| JP | 2001-127557 A | 5/2001 |
| JP | 2001-203541 A | 7/2001 |
| JP | 2001-339253 A | 12/2001 |
| JP | 2002-64201 A | 2/2002 |
| JP | 2002-76784 A | 3/2002 |
| JP | 2003-23325 A | 1/2003 |
| JP | 2004-200767 A | 7/2004 |

OTHER PUBLICATIONS

Japanese Office Action dated Mar. 4, 2008 issued in corresponding Application No. 2004-335982.

* cited by examiner

*Primary Examiner*—Robert J. Pascal
*Assistant Examiner*—Hieu Nguyen
(74) *Attorney, Agent, or Firm*—Westerman, Hattori, Daniels & Adrian, LLP.

(57) ABSTRACT

An amplifier circuit includes an amplifier having an amplifying device composed of GaN or a GaN compound semiconductor used for an active region, and a distortion compensation circuit that is connected to the amplifier, has an attenuation characteristic, and has a negative phase distortion.

10 Claims, 12 Drawing Sheets

| OUTPUT OF AMPLIFIER 2 (SET VALUE) | $P_1$ | $P_2$ | ... | ... | ... | ... | $P_n$ |
|---|---|---|---|---|---|---|---|
| BIAS VALUE | $V_1$ | $V_2$ | ... | ... | ... | ... | $V_n$ |

AMPLIFIER CIRCUIT, CONTROL METHOD OF THE SAME, AND AMPLIFIER CIRCUIT MODULE

BACKGROUND OF THE INVENTION

1. Field of the Invention

This invention generally relates to an amplifier circuit that utilizes a semiconductor device in which GaN or a GaN compound semiconductor element (hereinafter, referred to as GaN-based semiconductor device) is employed for an active region.

2. Description of the Related Art

These years, the GaN-based semiconductor devices such as FET or HEMT that includes GaN, AlGaN, or InAlGaN, which attract attention, enable a higher output than other devices that include Si or GaAs. For example, the GaN-based semiconductor devices are expected to apply to mobile telephones or base stations of the mobile telephones, as described in Japanese Patent Application Publication No. 9-246471.

In order to put the GaN-based semiconductor devices to practical use, it is important to grasp the specific characteristic. However, actual studies of the GaN-based semiconductor devices have recently started and there are still many unknowns at present.

The inventor of the present invention has found that a positive phase distortion occurs on the GaN-based semiconductor device. Generally, it is ideal that an amplifying device amplifies the input signal to maintain a constant phase difference between the input and output, regardless of the relationship between the input signal and output power. However, on the GaN-based semiconductor device, the phase of the output signal is distorted as the output power increases, as shown in FIG. 1. There has been no proposal for the method of correcting the phase distortion in the amplifier circuit having the GaN-based semiconductor device.

SUMMARY OF THE INVENTION

The present invention has been made in view of the above circumstances and provides an amplifier circuit, control method of the same, and amplifier circuit module, which can compensate a phase distortion in the amplifier circuit having a GaN-based semiconductor device.

According to one aspect of the present invention, preferably, there is provided an amplifier circuit including an amplifier having an amplifying device composed of GaN or a GaN compound semiconductor used for an active region; and a distortion compensation circuit that is connected to the amplifier, has an attenuation characteristic, and has a negative phase distortion. On the amplifier having the amplifying device composed of GaN or the GaN compound semiconductor used for the active region, it is possible to compensate the phase distortion occurred on the amplifier, by connecting the distortion compensation circuit with a negative phase distortion to the amplifier.

According to another aspect of the present invention, preferably, there is provided an amplifier circuit including a first amplifier that has a negative phase distortion; and a second amplifier that is connected to the first amplifier and has an amplifying device composed of GaN or a GaN compound semiconductor used for an active region. Even if the second amplifier having the amplifying device composed of GaN or the GaN compound semiconductor used for the active region is additionally provided, it is possible to compensate the phase distortion generated in the second amplifier with the first amplifier having the negative phase distortion.

According to still another aspect of the present invention, preferably, there is provided a method of controlling an amplifier circuit. The amplifier circuit may include a distortion applying portion having a negative phase distortion; and an amplifying portion that is connected to the distortion applying portion and has an amplifying device composed of GaN or a GaN compound semiconductor used for an active region. A phase distortion amount to be applied by the distortion applying portion may be controlled on the basis of information showing a phase distortion of an output from the amplifying portion. Even if the output from the amplifying portion is variable, it is possible to compensate the phase distortion of the amplifying portion by controlling the phase compensation amount of the distortion applying portion.

According to yet another aspect of the present invention, preferably, there is provided an amplifier circuit module including a first amplifier chip that is composed of a laterally diffused silicon MOS transistor and has a negative phase distortion; and a second amplifier chip that is electrically coupled to the first amplifier chip and is composed of an amplifying device composed of GaN or a GaN compound semiconductor used for an active region. The first amplifier chip and the second amplifier chip may be mounted on a common die stage.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 2:
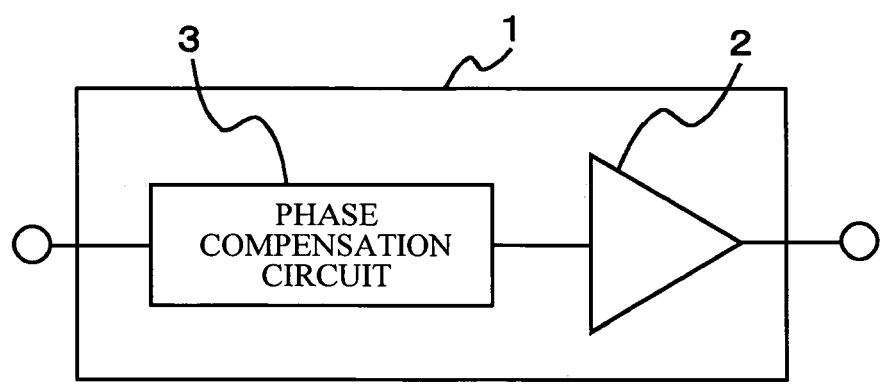
FIG. 2 is a view showing a configuration of the amplifier circuit having a distortion compensation circuit in accordance with a first embodiment of the present invention.

A description will be given of a first embodiment of the present invention, with reference to FIG. 2. An amplifier circuit 1 having a distortion compensation circuit in accordance with a first embodiment of the present invention includes an amplifier 2 and a phase compensation circuit 3. The phase compensation circuit 3 is connected to the amplifier 2. The phase compensation circuit 3 has an attenuation characteristic. The circuit with the attenuation characteristic denotes a circuit that does not generate energy, for instance, amplification or the like.

The amplifier 2 includes an amplifying device having an active region of GaN or a GaN compound semiconductor. Specifically, the amplifying device corresponds to HEMT (High Electron Mobility Transistor) or MESFET (Metal Semiconductor Filed Effect Transistor). HEMT is a semiconductor device in which AlGaN is employed for an electron supply layer and GaN or InGaN is employed for an electron transit layer. MESFET is a semiconductor device in which GaN or InGaN is employed for a channel layer.

Figure 3:
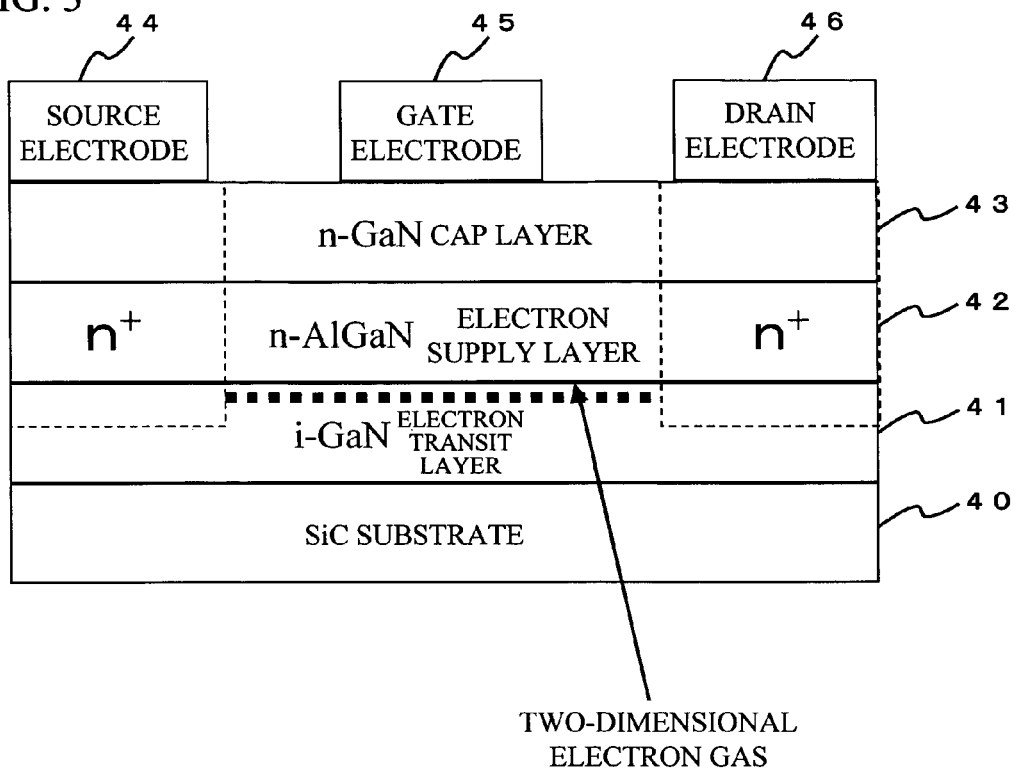
FIG. 3 shows an example of a structure of HEMT with an electron transit layer of GaN.
Figure 4:
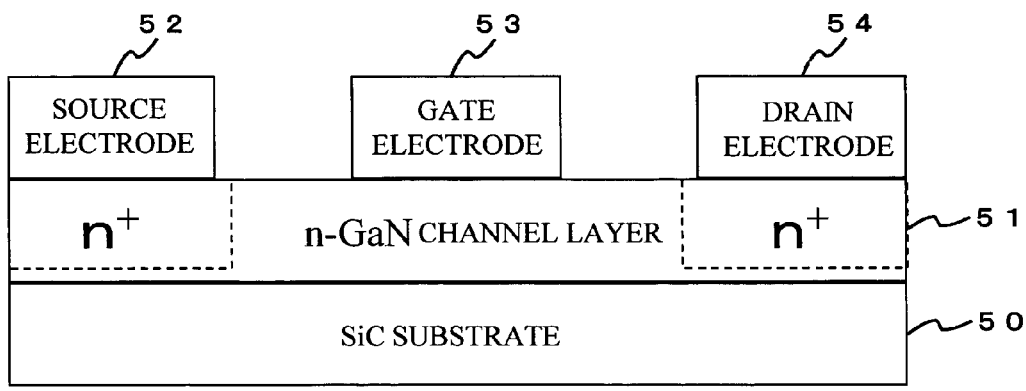
FIG. 4 shows an example of a structure of MESFET with a channel layer of GaN.

FIG. 3 shows an example of a structure of HEMT. FIG. 4 shows an example of a structure of MESFET. The HEMT shown in FIG. 3 includes an insulating substrate 40 of SiC, sapphire, or the like. On the substrate 40, there are successively deposited an electron transit layer 41 of i-GaN, an electron supply layer 42 of n-AlGaN, a cap layer 43 of n-GaN. A source electrode 44, a gate electrode 45, and a drain electrode 46 are formed on the surface of the cap layer 43 of n-GaN. The MESFET shown in FIG. 4 includes an insulating substrate 50 of SiC, sapphire, or the like. A channel layer 51 of n-GaN is formed on the substrate 50. A source electrode 52, a gate electrode 53, and a drain electrode 54 are formed on the surface of the channel layer 51.

Figure 5:
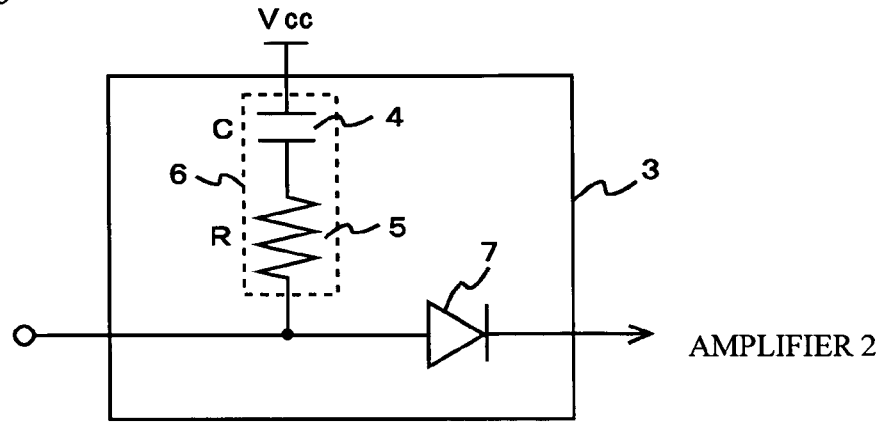
FIG. 5 is a view showing a structure of a phase compensation circuit.

Now the phase compensation circuit 3 will be described. The phase compensation circuit 3 applies a negative phase distortion to an input signal. Referring to FIG. 5, the phase compensation circuit 3 includes a bias circuit 6 and a diode 7. A direct-current blocking capacitor 4 and a resistor 5 are connected in series in the bias circuit 6. The diode 7 is biased by the bias circuit 6 to operate in a non-linear region. The amount of phase distortion is determined by selecting the value of the resistor 5 as necessary.

Figure 1:
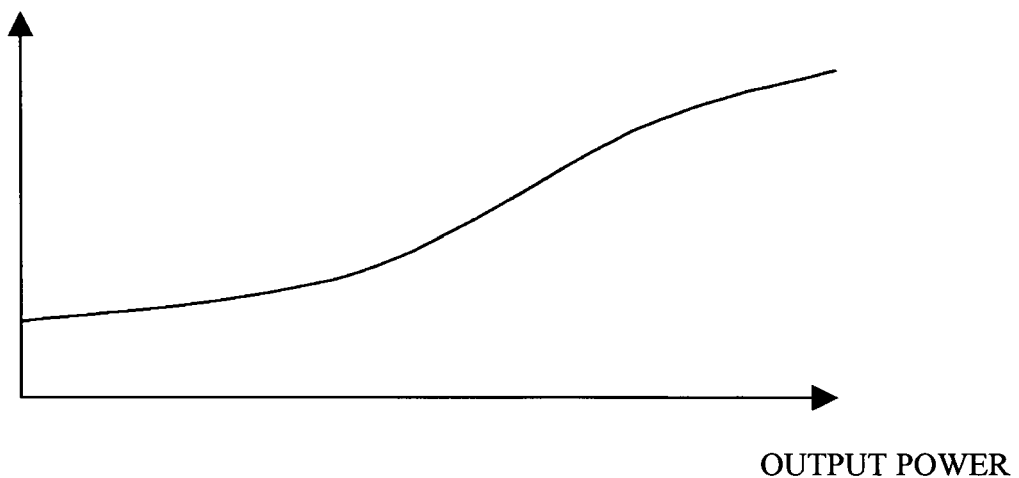
FIG. 1 is a view showing a characteristic of an amplifier circuit that utilizes a GaN-based semiconductor.
Figure 6:
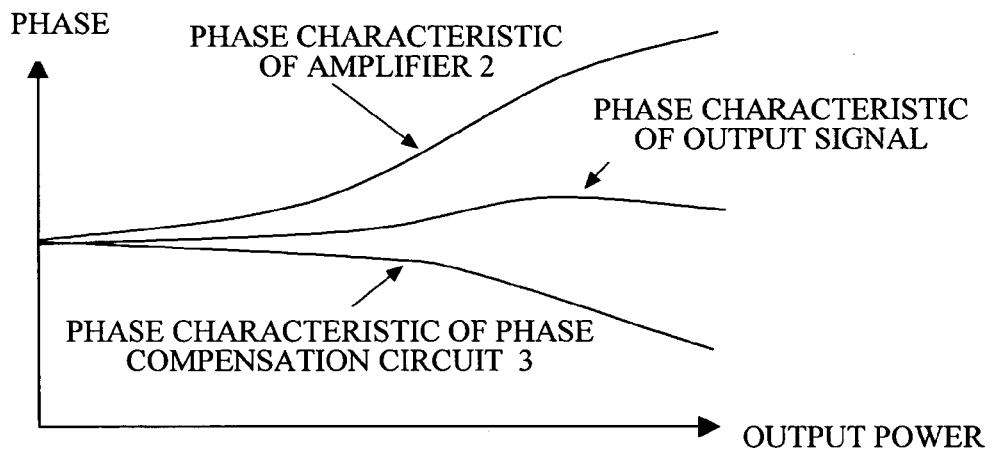
FIG. 6 shows phase the characteristic of an amplifier 2 and a phase compensation circuit 3 and those of an output signal.

The phase compensation circuit 3 generates the negative phase distortion according to the change in the power of the input signal. The amplifier 2 has a constant amplification degree as described, and the output power of the amplifier 2 also varies depending on the input power. The phase compensation circuit 3 changes the amount of phase distortion according to the input power, and the amount of phase distortion of the amplifier 2 also varies depending on the input power. Accordingly, the amount of phase distortion is compensated according to the input power on the whole. FIG. 6 shows variations in the phase characteristic of the output signal, yet the phase characteristic is largely improved as compared to those of the amplifier shown in FIG. 1. Thus, it can be proved that the present invention is effective.

Second Embodiment

Figure 7:
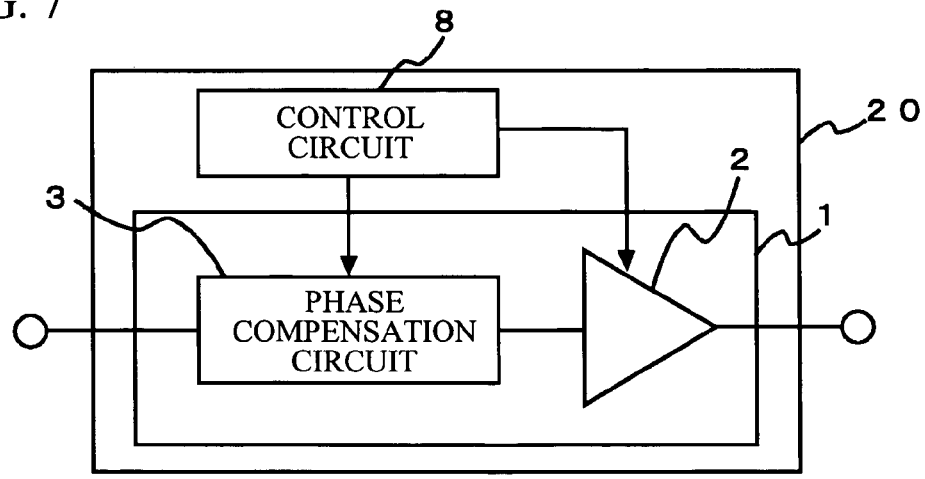
FIG. 7 is a view showing a configuration of the amplifier circuit having the distortion compensation circuit in accordance with a second embodiment of the present invention.

A description will be given, with reference to accompanying drawing, of a second embodiment of the present invention. FIG. 7 shows a configuration of an amplifier 20. The amplifier 20 includes the amplifier circuit 1 having the distortion compensation circuit and a control circuit 8 that controls the amplifier circuit 1 having the distortion compensation circuit. The control circuit 8 is connected to the amplifier circuit 1 having the distortion compensation circuit on a terminal for external device connection, and is capable of controlling to change the bias of the phase compensation circuit 3. The phase compensation circuit 3 corresponds to a distortion applying portion of a method of controlling an amplifier circuit, and the amplifier 2 corresponds to an amplifying portion.

Figures 8, 9:
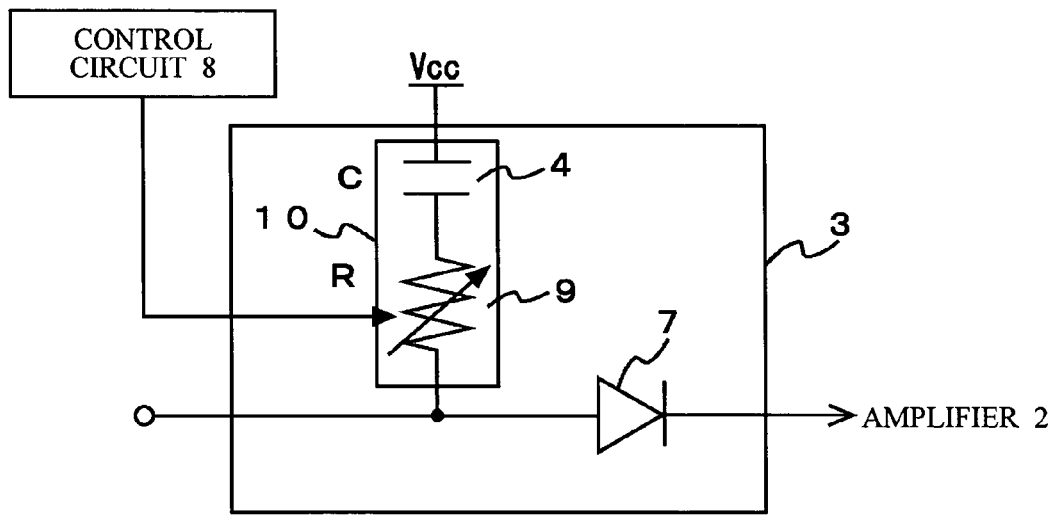
FIG. 8 is a view showing a configuration of the phase compensation circuit 3 in accordance with the second embodiment.
FIG. 9 is a view showing a structure of a look-up table.

The control circuit 8 controls the amplifier 2 so that the output from the amplifier 2 may have a set value according to an externally applied instruction, and also controls the amount of bias of the phase compensation circuit 3 (phase compensation amount), which corresponds to the amount of phase distortion introduced by the set value output from the amplifier as a parameter. That is to say, the control circuit 8 in FIG. 8 controls a resistance value of a variable resistor 9 in a bias circuit 10. For the afore-mentioned operation, a ROM is mounted on the control circuit 8 to store a look-up table, which includes combinations of the output values (set value) of the amplifier 2 and bias values of the phase compensation circuit 3. The control circuit 8 refers to the look-up table and determines the optimal phase compensation amount.

Figure 10:
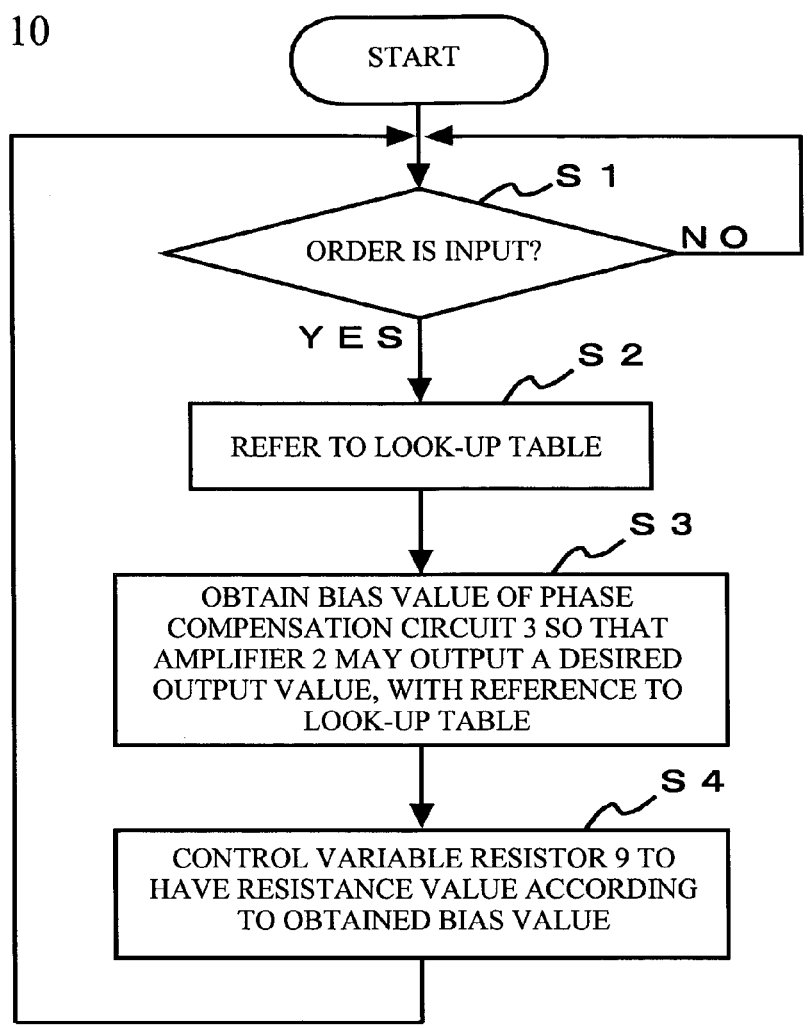
FIG. 10 is a flowchart showing a control procedure of a control circuit 8.

A description will be given of, with reference to a flowchart shown in FIG. 10, a control procedure of the control circuit 8. An instruction is externally applied to the control circuit 8 (step S1), and then the control circuit 8 refers to the look-up table to obtain the bias value of the phase compensation circuit 3 (step S2). The control circuit 8 obtains the bias value of the phase compensation circuit 3 so that the amplifier 2 may output a desired output value, with reference to the look-up table (step S3). When the bias value of the phase compensation circuit 3 is obtained, the control circuit 8 controls the variable resistor 9 to have the resistance value according to such obtained bias value (step S4).

According to the present embodiment, even if the output from the amplifier is variable, it is possible to produce the phase compensation amount suitable for the output in the phase compensation circuit. The phase compensation can be controlled more accurately.

Third Embodiment

Figure 11:
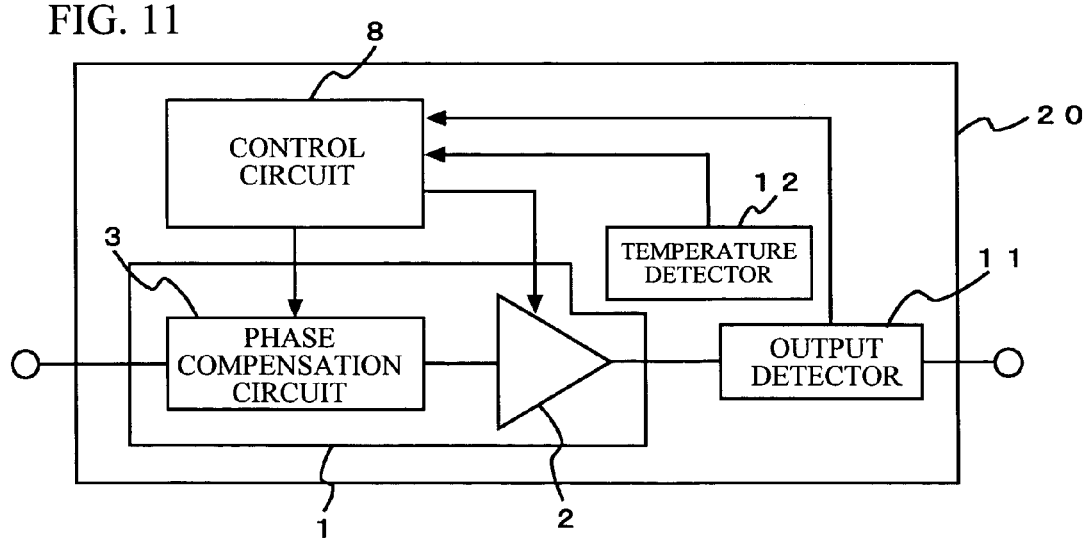
FIG. 11 is a view showing a configuration of the amplifier circuit having the distortion compensation circuit in accordance with a third embodiment of the present invention.

A description will be given, with reference to accompanying drawing, of a third embodiment of the present invention. The present embodiment is an improvement of the second embodiment. In addition to the configuration in accordance with the second embodiment, an output detector 11 is provided on the output side of the amplifier 2 so as to detect the output from the amplifier 2, as shown in FIG. 11. A temperature detector 12 is also provided near the amplifier 2. The phase compensation circuit 3 corresponds to the distortion applying portion of the method of controlling the amplifier circuit, and the amplifier 2 corresponds to the amplifying portion.

In the present embodiment, the control circuit 8 actually monitors the output from the amplifier 2, referring to detection information of the output detector 11. Accordingly, it is possible to specify the amount of phase distortion more accurately than referring to the set value of the output as described in the second embodiment. The output detector 11 also functions for a feedback control (APC control) to stabilize the output from the amplifier 2.

Figure 12:
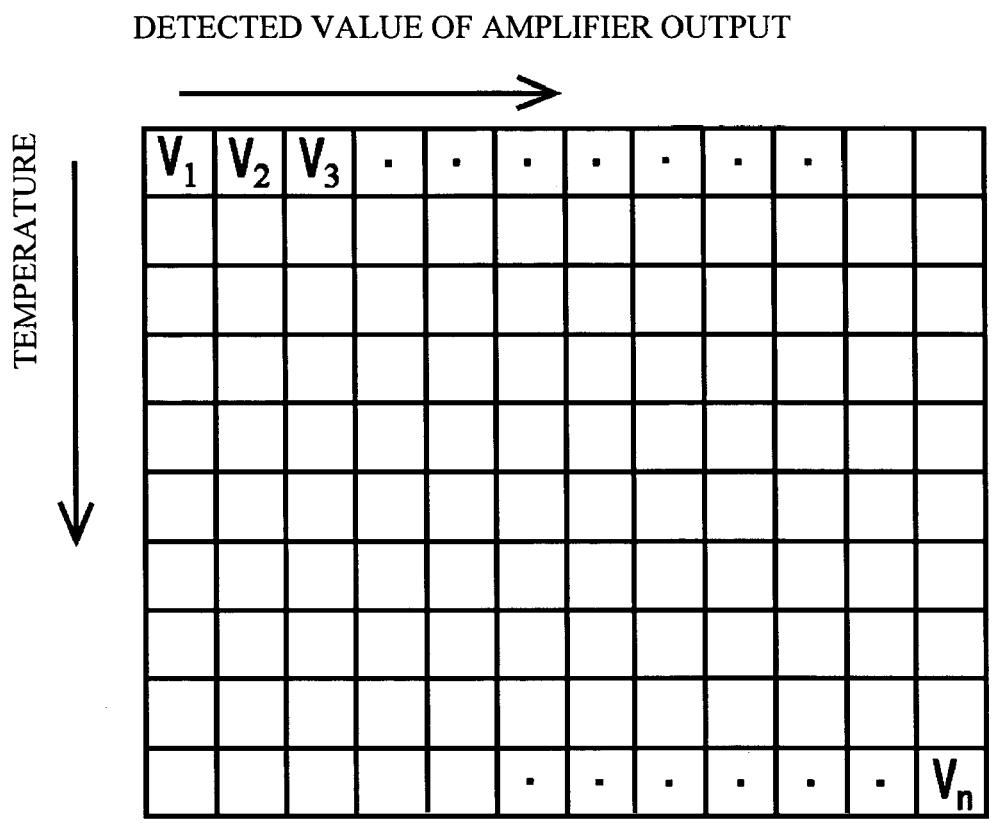
FIG. 12 is a view showing a structure of the look-up table.

In some cases, the amount of phase distortion varies depending on the temperature, even if the output power is equal. In the present embodiment, the temperature detector 12 is included, and it is possible to control the phase compensation circuit 3 by referring to the detection information and understanding the amount of phase distortion of the amplifier 2 exactly. Specifically, referring to FIG. 12, the look-up table mounted on the control circuit 8 additionally includes the optimal phase compensation amount that varies depending on the temperature. With the detection information of the output detector 11 and the detection information of the temperature detector 12, the optimal bias amount of the phase compensation circuit 3 is determined.

Figure 13:
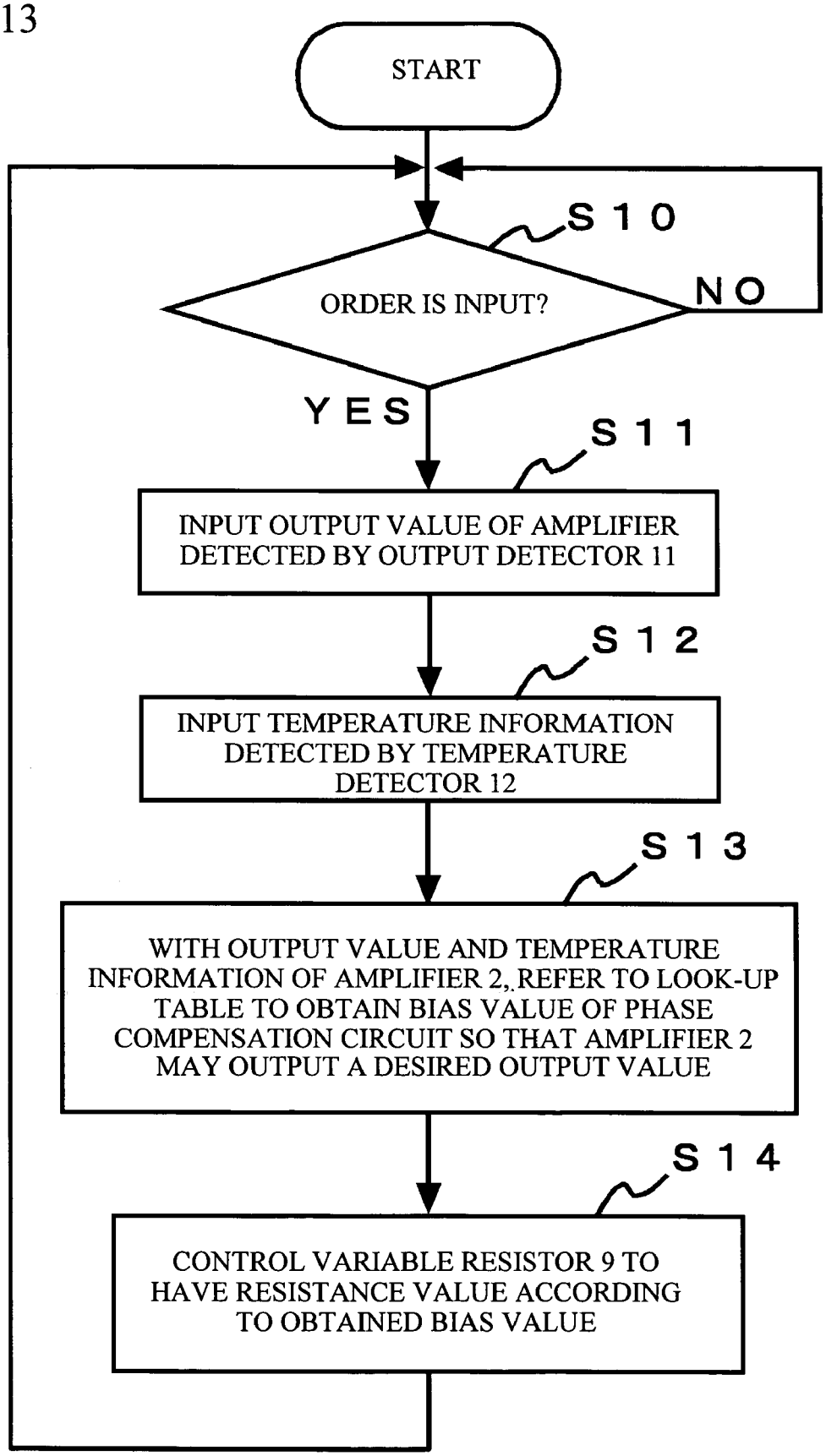
FIG. 13 is a flowchart showing a control procedure of the control circuit.

A description will be given of, with reference to a flowchart shown in FIG. 13, the control procedure of the control circuit 8. An instruction is externally applied to the control circuit 8 (step S10), and then the control circuit 8 obtains the bias value of the phase compensation circuit 3 to be the desired output value, with the output value from the amplifier 2 that is input from the output detector 11 (step S11) and the temperature information input from the temperature detector 12 (step S12). The look-up table shown in FIG. 12 stores the bias values of the phase compensation circuit 3 to have the desired output values from the amplifier 2, which are obtained according to the detected output value and temperature of the amplifier 2. The control circuit 8 obtains the bias value of the phase compensation circuit 3, referring to the look-up table (step S13). When the bias value of the phase compensation circuit 3 is obtained, the control circuit 8 controls the variable resistor 9 to have the resistance value according to such obtained bias value (step S14).

Fourth Embodiment

Figure 14:
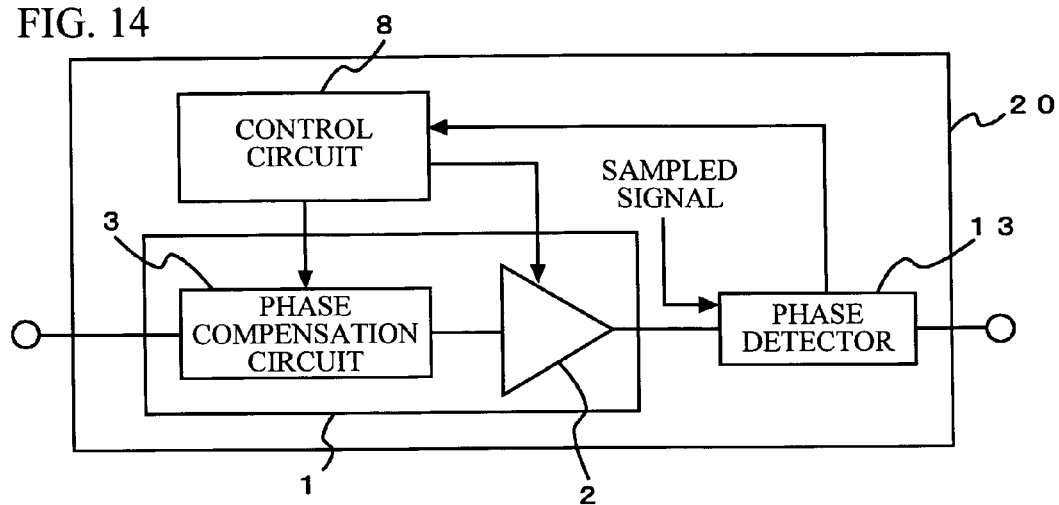
FIG. 14 is a view showing a configuration of the amplifier circuit having the distortion compensation circuit in accordance with a fourth embodiment of the present invention.

A description will be given, with reference to accompanying drawing, of a fourth embodiment of the present invention. In the third embodiment of the present invention, the output power of the amplifier 2 is grasped by the output detector 11 and the corresponding phase distortion amount is specified. However, the phase compensation circuit 3 can be controlled by detecting the phase distortion amount. In this case, a phase detector 13 may be provided instead of the output detector 11, as shown in FIG. 14.

In the present embodiment, the temperature detector 12 is not included, whereas the temperature detector 12 is described in the third embodiment. This is because the phase detector 13 is capable of obtaining the phase distortion amount. Both a sampled signal of a constant frequency and the output signal from the amplifier 2 are input into the phase detector 13. Then, a compared result is obtained by a phase comparator, which is well known for the PLL synthesizer, and is set as a phase detection output.

Fifth Embodiment

A description will now be given, with reference to accompanying drawing, of a fifth embodiment of the present invention. The phase compensation circuit 3 is prepared for compensating the phase, in accordance with the first through fourth embodiments of the present invention. An amplifier circuit 30 having the distortion compensation circuit in accordance with the present embodiment includes a phase compensation amplifier 14 instead of the phase compensation circuit 3. The phase compensation amplifier 14 is connected to the amplifier 2.

Figure 15:
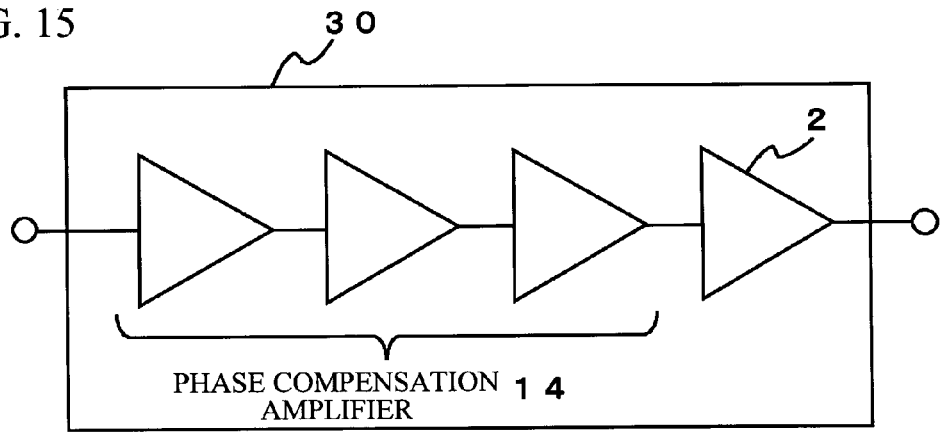
FIG. 15 is a view showing a configuration of the amplifier circuit having the distortion compensation circuit in accordance with a fifth embodiment of the present invention.

The phase compensation amplifier 14, referring to FIG. 15, includes multiple stages of amplifiers (three stages in accordance with the present embodiment, for example). Each of the amplifiers is composed of a LDMOS (Laterally Diffused MOS transistor). The amplifier 2 is composed of the FET having the channel layer of GaN as in the first embodiment of the present invention.

Figure 16:
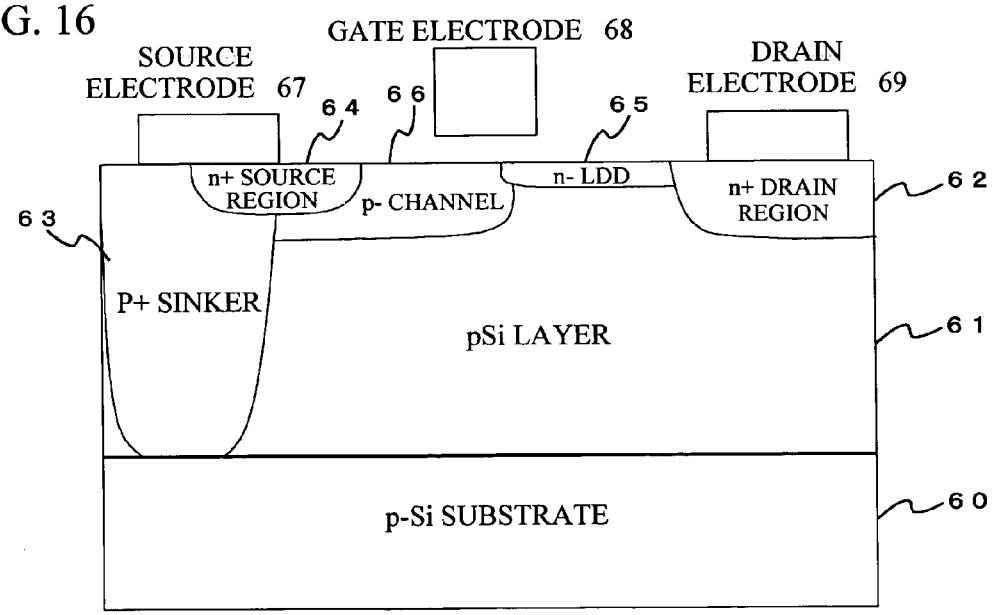
FIG. 16 is a cross-sectional view showing a configuration of an LDMOS.

FIG. 16 shows a configuration of the LDMOS. The LDMOS includes a p-Si substrate 60. A pSi layer 61 is provided on the p-Si substrate 60. A source electrode 67, a gate electrode 68, and a drain electrode 69 are provided on the surface of the pSi layer 61. An n+ drain region 62, an n− LDD 65, a p+ sinker 63, an n+ source region 64, and a p−channel 66 are provided in the pSi layer 61.

Figure 17:
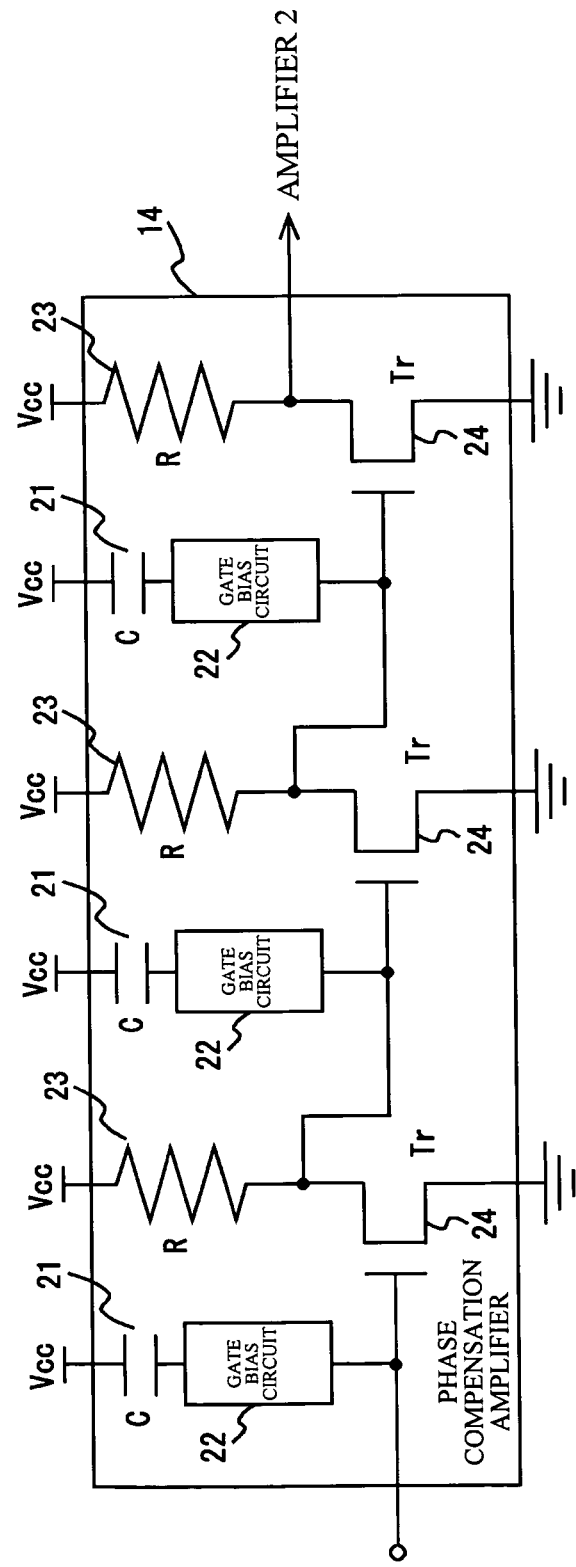
FIG. 17 shows an equivalent circuit of a phase compensation amplifier 14.
Figure 18:
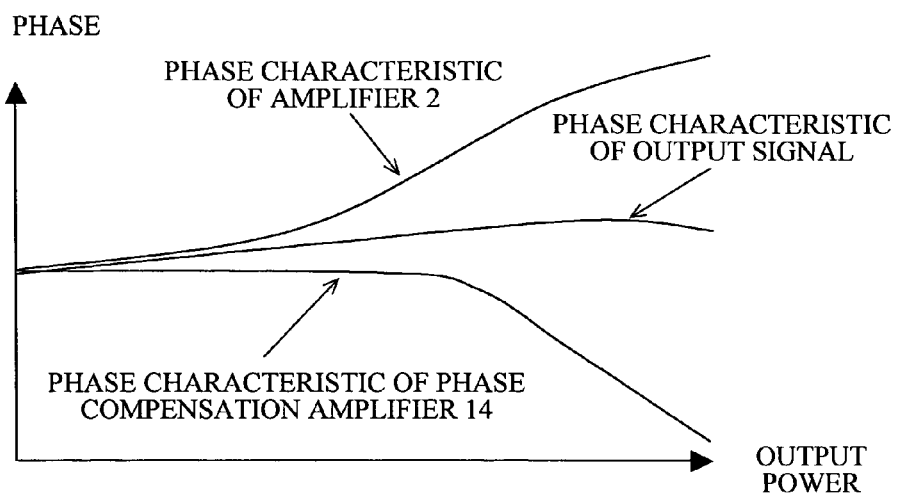
FIG. 18 shows the phase characteristic of the amplifier 2 and the phase compensation amplifier 14 and those of an output signal.

The phase compensation amplifier 14 composed of the LDMOS has the negative phase distortion relative to the output power, as shown in FIG. 18. The whole phase distortion is reduced by adding the positive phase distortion of the amplifier 2. FIG. 17 shows an equivalent circuit of the phase compensation amplifier 14. The phase compensation amplifier 14 shown in FIG. 17 includes a transistor (Tr) 24, a direct-current blocking capacitor 21, and a gate bias circuit 22. The direct-current blocking capacitor 21 connected in series with the gate bias circuit 22 is further connected by a gate of the transistor 24. A given amount of bias is supplied to the gate of the transistor 24 by the gate bias circuit 22 to obtain a given amount of negative phase distortion.

The amplifier 2 in accordance with the present embodiment also has a constant amplification degree as described in the first embodiment. Also, the phase compensation amplifier 14 has a constant amplification degree. Accordingly, both the amplifier 2 and the phase compensation amplifier 14 vary the phase characteristic of the power output according to the input power. The phase distortion of the output signal is reduced by adequately adjusting the gate bias of the phase compensation amplifier 14 and compensating the phase distortion of the amplifier 2.

Sixth Embodiment

A description will now be given, with reference to accompanying drawing, of a sixth embodiment of the present invention. An amplifier 31 in accordance with the present embodiment of the present invention includes the control circuit 8 that controls the gate bias of the phase compensation amplifier 14, with reference to FIG. 19.

Figure 19:
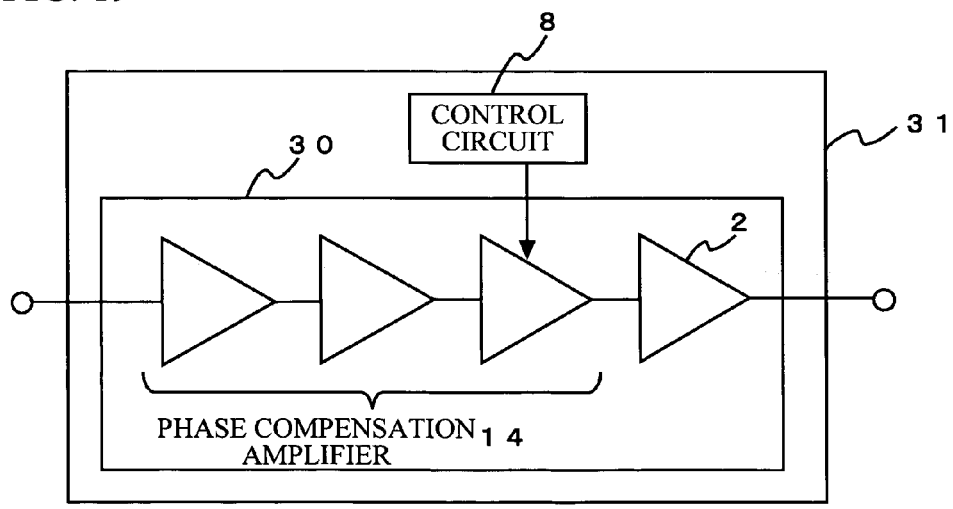
FIG. 19 is a view showing a configuration of the amplifier circuit having the distortion compensation circuit in accordance with a sixth embodiment of the present invention.
Figure 20:
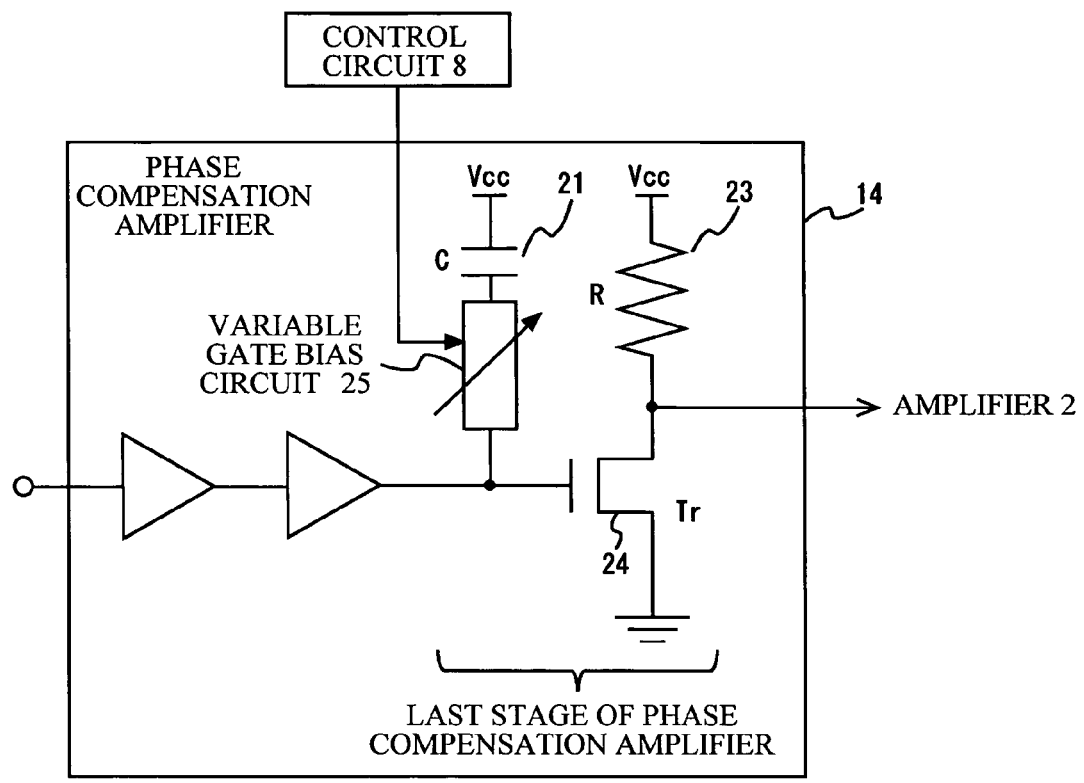
FIG. 20 shows an equivalent circuit of the phase compensation amplifier.

The control circuit 8 may control each stage included in the phase compensation amplifier 14, yet only an adjacent stage of the amplifier 2 is controlled, as shown in FIG. 19. Referring now to FIG. 20, the gate bias circuit is configured to be a variable gate bias circuit 25. The control circuit 8 controls the variable gate bias circuit 25 to control to bias the transistor (Tr) 24. This is because the former part of the stages in the phase compensation amplifier 14 is made to operate in a relatively large back-off region to emphasize the repeatability of the signal waveform. Here, the back-off denotes a difference in the output saturation power between the output signal relative and the average power. As the back-off region becomes smaller, the operating point is closer to a saturation region. At the operating point close to the saturation region, the distortion of the signal waveform is relatively great and the large back-off region cannot be provided in the former part. However, referring to FIG. 18 showing the fifth embodiment of the present invention, the phase distortion is large on the side of the higher output, namely, on the side of the smaller back-off region. Accordingly, it is more effective to control the phase compensation amount sufficiently with the stage in the latter part having a smaller back-off region than the former part of the stages having a larger back-off region. The control operation of the control circuit 8 is omitted here, as already described in the second embodiment.

Seventh Embodiment

Figure 21:
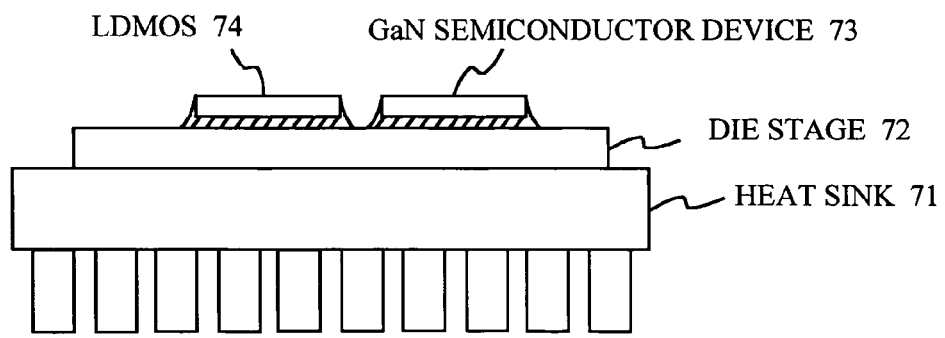
FIG. 21 is a view showing a configuration of an amplifier module incorporated into one package.

A description will now be given of a configuration of a package that mounts the amplifier circuit 1 having the phase compensation amplifier 14 in accordance with the fifth embodiment or the amplifier circuit 1 in accordance with the sixth embodiment of the present invention. Referring to FIG. 21, an LDMOS 74 and a GaN-based semiconductor device 73 having the substrate of SiC, Si, or sapphire are mounted on a common die stage 72 so as to be incorporated into one package. The phase compensation amplifier 14 in accordance with the fifth embodiment of the present invention is formed on the LDMOS 74. The amplifier 2 in accordance with the fifth embodiment of the present invention is formed on the GaN-base semiconductor device 73.

The afore-mentioned amplifier module is incorporated into one package, the combinations of Si and Si, Si and SiC, and Si and sapphire respectively have approximate values in the thermal expansion coefficient. Therefore, the mechanical distortion according to the difference in the thermal expansion coefficient with the die stage 72 is smaller than a combination of Si and GaAs, which is a representative example of the high-output amplifier. That is to say, in the combination of the Si device and GaAS device, both of the thermal expansion coefficients are relatively large. Even if the die stage having an intermediate thermal expansion coefficient is employed, large mechanical distortions are applied to both devices on the basis of the difference in the thermal expansion coefficient, resulting in the change of the device characteristics. This is apparent in the field of electric amplifier having a large calorific value.

The LDMOS and the GaN-based semiconductor device, on the other hand, have approximate thermal expand coefficients. Therefore, it is possible to select the material of the die stage 72 close to the thermal expand coefficients, reducing the mechanical distortion relatively. The die stage 72 is thermally coupled to a heat sink 71. FIG. 21 shows a package where the die stage 72 and the heat sink 71 are coupled. However, the heat sink 71 may not be included in the package.

On the above-mentioned amplifier circuit module, the die stage may be thermally connected to a heat sink. It is possible to radiate heat from the amplifier chip effectively by thermally connecting the die stage and the heat sink.

On the above-mentioned amplifier circuit module, the die stage may have a thermal expansion coefficient in-between those of the first amplifier chip and the second amplifier chip. The die stage has the thermal expansion coefficient in-between those of the first amplifier chip and the second amplifier chip. This makes it possible to select a material of the die stage having the thermal expansion coefficient close to the first amplifier chip and the second amplifier chip respectively. It is therefore possible to reduce the mechanical distortion.

Figure 22:
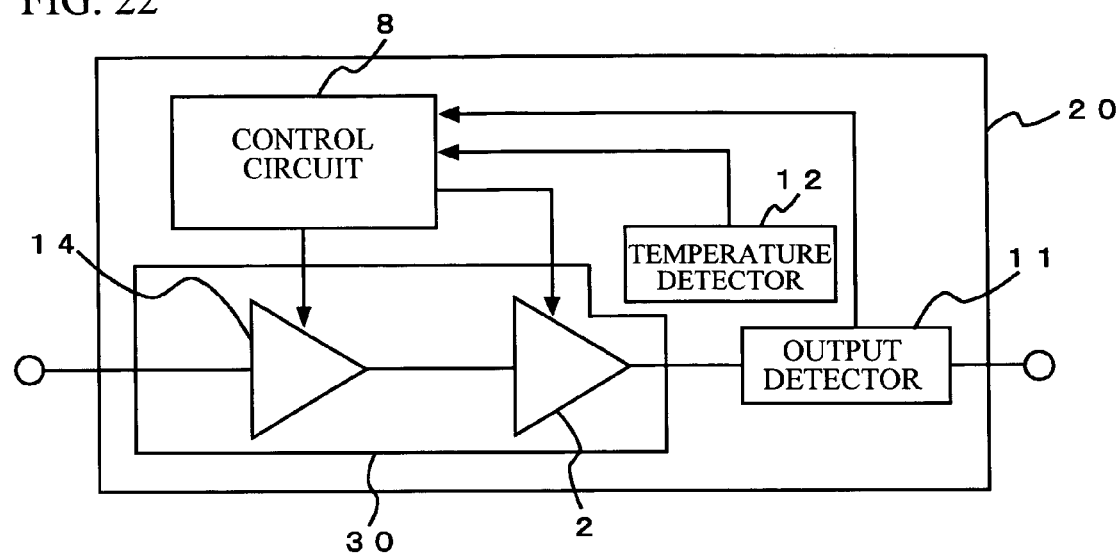
FIG. 22 is a view showing a configuration of a variation example in accordance with the third embodiment of the present invention.
Figure 23:
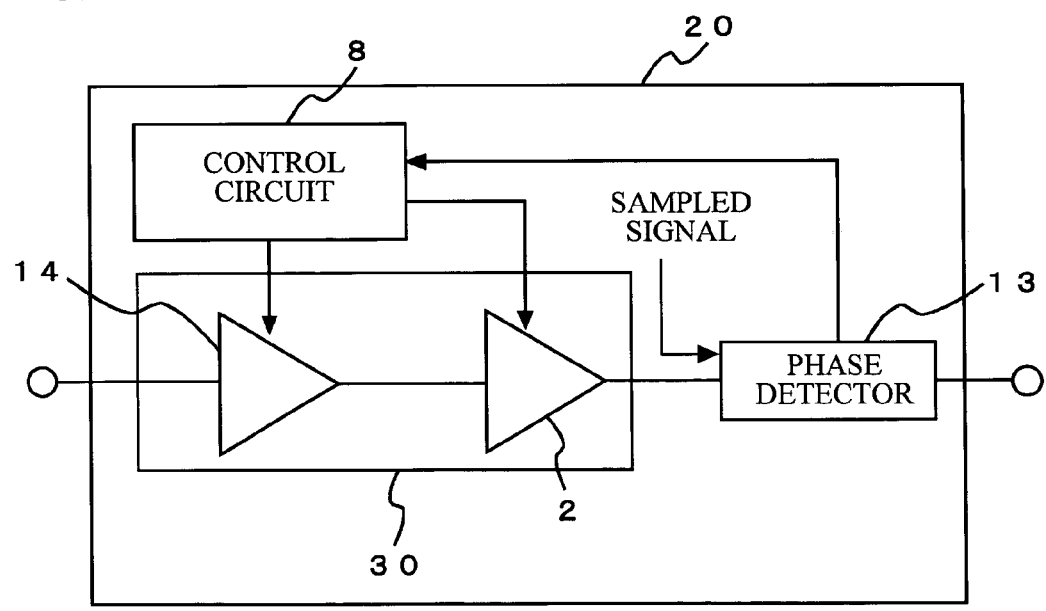
FIG. 23 is a view showing a configuration of a variation example in accordance with the fourth embodiment of the present invention.

The present invention is not limited to the above-mentioned embodiments, and other embodiments, variations and modifications may be made without departing from the scope of the present invention. For example, the phase compensation circuit 3 shown in FIGS. 11 and 14 may be replaced by the phase compensation amplifier 14 shown in FIGS. 22 and 23.

In addition, the first through fourth embodiments may be combined with the fifth and sixth embodiments as necessary. That is to say, the phase compensation circuit 3 in accordance with the first embodiment may be coupled to the phase compensation amplifier 14 in accordance with the fifth embodiment, so that the positive phase distortion on the amplifying device of the GaN-based semiconductor can be compensated. In the configuration having the afore-mentioned combination, the phase characteristic can be controlled by both the phase compensation circuit 3 and the phase compensation amplifier 14. The parameters for the phase compensation are increased, producing the effect in controlling the phase compensation.

The present invention is based on Japanese Patent Application No. 2004-335982 filed on Nov. 19, 2004, the entire disclosure of which is hereby incorporated by reference.

What is claimed is:

1. An amplifier circuit comprising:
   a first amplifier that has a negative phase distortion, said phase distortion amount of said first amplifier being variable;
   a second amplifier that is connected to the first amplifier and has an amplifying device composed of GaN or a GaN compound semiconductor used for an active region; and
   a control circuit that varies said phase distortion amount of the first amplifier, according to information on an output of the second amplifier.

2. The amplifier circuit as claimed in claim 1, wherein the control circuit includes a look-up table that stores values for varying the phase distortion amount of the first amplifier to correspond to the information on an output of the first amplifier.

3. The amplifier circuit as claimed in claim 1, further comprising an output detector that detects the output of the second amplifier, wherein the control circuit varies the phase distortion amount on the basis of information on the output detector.

4. The amplifier circuit as claimed in claim 1, further comprising a temperature detector that detects a temperature of the second amplifier, wherein the control circuit corrects the values for varying the phase distortion amount on the basis of information on the temperature detector.

5. The amplifier circuit as claimed in claim 1, further comprising a phase detector that detects an output phase of the second amplifier, wherein the control circuit varies the phase distortion amount on the basis of information on the phase detector.

6. An amplifier circuit module comprising:
 a first amplifier chip that is composed of a laterally diffused silicon MOS transistor and has a negative phase distortion, said phase distortion amount of said first amplifier chip being variable;
 a second amplifier chip that is electrically coupled to the first amplifier chip and is composed of an amplifying device composed of GaN or a GaN compound semiconductor used for an active region; and
 a control circuit that varies said phase distortion amount of the first amplifier chip, according to information on an output of the second amplifier chip,
 wherein the first amplifier chip and the second amplifier chip are mounted on a common die stage.

7. The amplifier circuit module as claimed in claim 6, wherein the first amplifier chip is formed on a silicon substrate and the second amplifier chip is formed on a substrate of any one of silicon, silicon carbide, and sapphire.

8. The amplifier circuit module as claimed in claim 6, wherein the die stage is thermally connected to a heat sink.

9. The amplifier circuit module as claimed in claim 6, wherein the die stage has a thermal expansion coefficient in-between those of the first amplifier chip and the second amplifier chip.

10. The amplifier circuit module as claimed in claim 6, wherein the amplifying device is an FET composed of GaN or a GaN compound semiconductor used for a channel layer or a HEMT composed of GaN or a GaN compound semiconductor used for an electron transit layer.

* * * * *